United States Patent
Cho et al.

(10) Patent No.: US 7,915,138 B2
(45) Date of Patent: Mar. 29, 2011

(54) METHODS OF MANUFACTURING NON-VOLATILE MEMORY DEVICES

(75) Inventors: Hye-Jin Cho, Gyeonggi-do (KR); Kyu-Charn Park, Gyeonggi-do (KR); Choong-Ho Lee, Gyeonggi-do (KR); Byung-Yong Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 36 days.

(21) Appl. No.: 12/485,577

(22) Filed: Jun. 16, 2009

(65) Prior Publication Data

US 2009/0253243 A1 Oct. 8, 2009

Related U.S. Application Data

(62) Division of application No. 11/616,582, filed on Dec. 27, 2006, now abandoned.

(30) Foreign Application Priority Data

Oct. 2, 2006 (KR) .................................. 2006-97260

(51) Int. Cl.
*H01L 21/76* (2006.01)

(52) U.S. Cl. ........ 438/435; 438/218; 438/221; 438/257; 257/E21.54; 257/E21.546

(58) Field of Classification Search .................. 438/176, 438/195, 196; 257/E21.179, E21.457, E21.613
See application file for complete search history.

(56) References Cited

U.S. PATENT DOCUMENTS

| 6,548,374 | B2 | 4/2003 | Chung | |
|---|---|---|---|---|
| 2002/0197823 | A1 * | 12/2002 | Yoo et al. | 438/424 |
| 2006/0240619 | A1 * | 10/2006 | Ozawa et al. | 438/257 |

FOREIGN PATENT DOCUMENTS

| KR | 10-2005-0012005 | | 1/2005 |
|---|---|---|---|
| KR | 10-2005-0063266 | * | 6/2005 |
| KR | 2006-0078858 | | 7/2006 |

* cited by examiner

*Primary Examiner* — Cheung Lee
(74) *Attorney, Agent, or Firm* — Myers Bigel Sibley & Sajovec

(57) ABSTRACT

In a method of manufacturing a non-volatile memory device, a conductive structure is formed on a substrate. The conductive structure includes a tunnel oxide pattern, a first conductive pattern, a pad oxide pattern and a hard mask pattern. A trench is formed on the substrate using the conductive structure as an etching mask. An inner oxide layer is formed on an inner wall of the trench and sidewalls of the tunnel oxide pattern and the first conductive pattern. The inner oxide layer is cured, thereby forming a silicon nitride layer on the inner oxide layer. A device isolation pattern is formed in the trench, and the hard mask pattern and the pad oxide pattern are removed from the substrate. A dielectric layer and a second conductive pattern are formed on the substrate. Accordingly, the silicon nitride layer prevents hydrogen (H) atoms from leaking into the device isolation pattern.

17 Claims, 14 Drawing Sheets

METHODS OF MANUFACTURING NON-VOLATILE MEMORY DEVICES

REFERENCE TO PRIORITY APPLICATION

This application is a divisional of U.S. patent application Ser. No. 11/616,582, filed Dec. 27, 2006 now abandoned, which claims priority to Korean Patent Application No. 2006-97260 filed Oct. 2, 2006, the contents of which are hereby incorporated herein by reference.

FIELD OF THE INVENTION

The present invention relates to methods of forming integrated circuit devices and, more particularly, to methods of forming non-volatile memory devices.

BACKGROUND OF THE INVENTION

A non-volatile memory device has characteristics in that data may be stored and erased by an electric operation, yet the data is not erased even when the power is turned off. Thus, the non-volatile memory device has been widely used in applications such as digital cellular phones, digital cameras, and local area network (LAN) switches. A unit cell of the non-volatile memory device may be classified into a NAND type or a NOR type. A NAND type non-volatile memory device (NAND memory) advantageously has a high integration density, and a NOR type non-volatile memory device (NOR memory) advantageously has a high operation speed. Because of these characteristics, the NAND memory has been widely used in the appliances requiring a high integration density rather than a high operation speed, whereas the NOR memory has been widely used in the appliances requiring a high operation speed rather than a high integration density.

The unit cell of the non-volatile memory device includes a tunnel oxide layer, a floating gate, a dielectric layer and a control gate that are sequentially stacked on a substrate. A threshold voltage of the unit cell is varied as electrons are transferred into or from the floating gate, and data is stored into the memory device using the variation of the threshold voltage. The transfer of electrons into the floating gate is performed by an injection of hot electrons having excessive energy from a channel into the floating gate or a Fowler-Nordheim tunneling, and the transfer of the electrons from the floating gate is performed by a Fowler-Nordheim tunneling.

Continuously performing erase and program operations using the non-volatile memory device requires a repetitive transfer of the electrons between the channel and the floating gate. Therefore, the characteristics of the substrate around the channel and the tunnel oxide layer may influence reliability and endurance of the memory device.

In particular, when an interface trap is formed between the tunnel oxide layer and the substrate, electrons may become trapped. As a result, electrons may not be sufficiently injected into the floating gate when data is stored into the memory device, and electrons may not be sufficiently discharged from the floating gate to the substrate when data is erased from the memory device. Accordingly, research has been conducted for reducing the interface traps between the tunnel oxide layer and the substrate. For example, Korean Patent Laid-Open Publication No. 2006-78858 discloses a method of processing a substrate to reduce the interface trap density. Particularly, a surface of the substrate is passivated with hydrogen (H), and accordingly, dangling bonds on the surface of the substrate are reacted with hydrogen atoms (H), to thereby produce a chemical bond of SiH or SiOH on the surface of the substrate. As a result, most of the interface traps are eliminated from the surface of the substrate.

However, when a non-volatile memory device is formed on the substrate passivated with hydrogen and is continuously operated by an injection and a discharge of electrons between the substrate and the floating gate through the channel, the chemical bond of SiH or SiOH may be broken and the hydrogen atoms of the chemical bond of SiH or SiOH may leak onto an insulation layer defining an active region of the substrate on which various conductive structures are formed (i.e. a device isolation layer). These leaked hydrogen atoms may deteriorate reliability and endurance of the non-volatile memory device.

SUMMARY OF THE INVENTION

Embodiments of the present invention include methods of forming non-volatile memory devices by forming a tunnel oxide layer pattern and a floating gate electrode pattern on a semiconductor substrate and forming a trench in a portion of the semiconductor substrate extending adjacent the floating gate electrode pattern. This trench is formed at a width and depth sufficient to support a trench isolation region (e.g. shallow trench isolation (STI) region). An electrically insulating layer is formed to line the sidewalls and bottom of the trench. This electrically insulating layer may be formed using an insulating layer deposition technique or a thermal oxidation technique, for example. The electrically insulating layer is then cured for a sufficient duration to increase a degree of impermeability of hydrogen (H) atoms therein. The trench is then filled with an electrical isolation region that extends on the cured electrically insulating layer. Steps may then be performed to form a control gate electrode pattern on the floating gate electrode pattern. Additional steps (e.g. back-end processing steps) may also be performed to complete the non-volatile memory device.

According to additional aspects of these embodiments, the curing of the electrically insulating layer includes nitrating the electrically insulating layer to form a silicon nitride layer on the electrically insulating layer. Here, the nitrating of the electrically insulating layer may include nitrating the electrically insulating layer by performing a plasma nitration process on the electrically insulating layer at a temperature in a range from about 15° C. to about 100° C. According to additional embodiments of the invention, the curing of the electrically insulating layer includes annealing the electrically insulating layer using a gas containing nitrogen, deuterium, fluorine and/or chlorine.

Still additional embodiments of the invention include forming a non-volatile memory device by forming a trench in a portion of a semiconductor substrate and forming an electrically insulating layer on a sidewall of the trench. The electrically insulating layer is cured for a sufficient duration to increase a degree of impermeability of hydrogen atoms therein. The trench is filled with an electrical isolation region that extends on the cured electrically insulating layer and protrudes vertically relative to a surface of the semiconductor substrate. A tunnel oxide layer is then formed on the surface of the semiconductor substrate, at a location adjacent the cured electrically insulating layer. In addition, a floating gate electrode pattern is formed that extends on the tunnel oxide layer and on a sidewall of a vertically protruding portion of the electrical isolation region. This step of forming a tunnel oxide layer may include thermally oxidizing the surface of the semiconductor substrate using the cured electrically insulating layer as an oxidation mask, which results in a self-aligned relationship between the tunnel oxide layer and the cured electrically insulating layer.

Still further embodiments of the invention include methods of forming a non-volatile memory device by forming a tunnel oxide layer pattern and a floating gate electrode pattern on a semiconductor substrate and forming a trench in a portion of the semiconductor substrate extending adjacent the floating gate electrode pattern. A first electrically insulating layer is formed on a sidewall of the trench and the trench is then filled with a first electrical isolation region. This first electrical isolation region extends on the first electrically insulating layer. The first electrical isolation region and the first electrically insulating layer are then etched back for a sufficient duration to expose a portion of the sidewall of the trench. Thereafter, a second electrically insulating layer is formed on the exposed portion of the sidewall of the trench. This second electrically insulating layer is cured for a sufficient duration to increase a degree of impermeability of hydrogen atoms therein. The trench is then refilled with a second electrical isolation region. This refilling of the trench may then be followed by etching back the second electrical isolation region and the cured second electrically insulating layer to expose a sidewall of the floating gate electrode pattern. An inter-gate dielectric layer is then formed on the exposed sidewall of the floating gate electrode pattern and a control electrode pattern is formed on the inter-gate dielectric layer.

BRIEF DESCRIPTION OF THE DRAWINGS

The above and other features and advantages of the present invention will become readily apparent by reference to the following detailed description when considering in conjunction with the accompanying drawings, in which.

DESCRIPTION OF THE EMBODIMENTS

Figure 1:
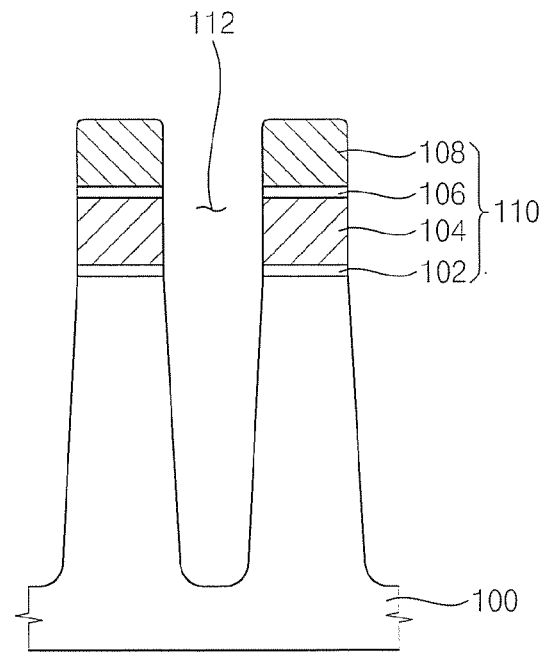
FIGS. 1 to 6 are cross-sectional views illustrating processing steps for a method of manufacturing a non-volatile memory device according to a first example embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on." "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below." "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

FIGS. 1 to 6 are cross-sectional views illustrating processing steps for a method of manufacturing a non-volatile memory device according to a first example embodiment of the present invention. Referring to FIG. 1, a tunnel oxide layer (not shown) is formed on a substrate 100 comprising a semiconductor material such as silicon. For example, the tunnel oxide layer may be formed by a thermal oxidation process for oxidizing a surface of the substrate 100. A first conductive layer (not shown) is formed on the tunnel oxide layer. The first conductive layer is to be formed into a floating gate electrode of the non-volatile memory device through subsequent processes. In an example embodiment, polysilicon doped with impurities may be deposited onto the tunnel oxide layer by a low pressure chemical vapor deposition (LPCVD) process. The impurities may be doped into the polysilicon by a diffusion of POCl3, an ion implantation and an in-situ doping process in which the impurities are doped into the polysilicon simultaneously with the LPCVD process.

A pad oxide layer (not shown) is formed on the first conductive layer. The pad oxide layer prevents the first conductive layer comprising polysilicon from making contact with a hard mask pattern 108 in a subsequent process. In an example embodiment, a silicon nitride layer is deposited onto the pad oxide layer, to thereby form a hard mask layer (not shown) on the pad oxide layer.

A photoresist pattern (not shown) is formed on the hard mask layer by a photolithography process. A top surface of the hard mask layer corresponding to a field region of the substrate in which the device isolation layer is to be formed is partially exposed through the photoresist pattern. The hard mask layer, a pad oxide layer, a first conductive layer and a tunnel oxide layer are sequentially etched using the photoresist pattern as an etching mask, thereby forming a tunnel oxide pattern 102, a first conductive pattern 104, a pad oxide pattern 106 and a hard mask pattern 108 that are sequentially stacked on the substrate 100. Hereinafter, the tunnel oxide pattern 102, the first conductive pattern 104, the pad oxide pattern 106 and the hard mask pattern 108 are referred to as structure 110 as a whole. In an example embodiment, the structure 110 is formed into a line shape extending in a first direction.

A surface of the substrate 100 is etched using the structure 110 as an etching mask, so that a trench 112 is formed at the field region of the substrate 100. In an example embodiment, a dry etching process may be performed for forming the trench 112. The trench 112 defines and surrounds the active region of the substrate 100, so that the conductive structures on the active region are electrically isolated from one another by the trench 112. For that reason, the trench 112 may be referred to as a device isolation area.

Figure 2:
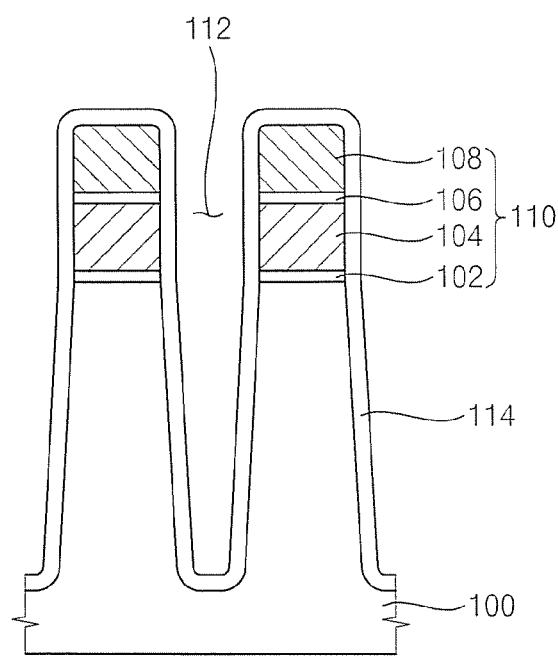

Referring to FIG. 2, an inner oxide layer 114 is formed along an inner wall of the trench 112, thereby curing damage to the substrate 100 during the dry etching process and minimizing current leakage trough the trench 112. In an example embodiment, the inner oxide layer 114 may be formed by a thermal oxidation process. The inner oxide layer 114 may be formed on the sidewalls and top surface of the structure 110 as well as the inner wall of the trench 112, so that an edge portion of an interface between the tunnel oxide pattern 102 and the substrate 100 is sufficiently covered with the inner oxide layer 114. For example, when a radical oxidation process is performed against the inner wall of the trench 112 in-situ with steam, an oxidation reaction is so actively generated on the inner wall of the trench that a silicon oxide is formed on the sidewalls and top surface of the structure 110 as well as on the inner wall of the trench 112.

Figure 3:
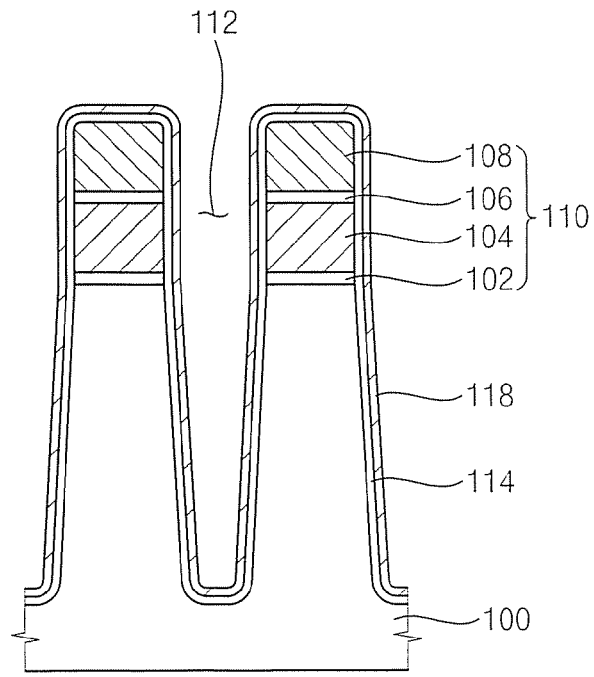

Referring to FIG. 3, the inner oxide layer 114 is sufficiently cured, so that hydrogen atoms in the interface between the substrate 100 and the tunnel oxide pattern 102 are sufficiently prevented from leaking into a subsequently formed device isolation layer. Then, a plasma nitration process is performed against a surface of the inner oxide layer 114, thereby forming a silicon nitride layer 118 on the inner oxide layer 114. When the plasma nitration process is performed at a high temperature above about 100° C. the silicon nitride layer 118 may be conformally formed on the inner oxide layer 114. The silicon nitride layer 118 formed on the inner oxide layer 114 that is formed on the inner wall of the trench 112 makes contact with a channel region and source/drain regions of the memory device, thereby increasing current leakage. In addition, when the plasma nitration process is performed at a low temperature below about 15° C., the generated plasma tends to be negligible, which would reduce efficiency of the plasma nitration process. Accordingly, the plasma nitration process may be typically performed at a temperature of about 15° C. to about 100° C. In the present embodiment the plasma nitration process is performed at a room temperature of about 25° C. As a result of the plasma nitration process the silicon nitride layer 118 is conformally formed on the surface of the inner oxide layer 114. An example reaction gas used in the plasma nitration process may include ammonia (NH3) gas.

The silicon nitride layer 118 on the inner oxide layer 114 may prevent hydrogen (H) atoms which are liberated from a chemical bond of SiH or SiOH on the surface of the substrate 100, from leaking into a device isolation layer (not shown in FIG. 3). As a result liberated hydrogen (H) atoms can be chemically bonded to interface traps around the surface of the substrate 100 at which the chemical bond of SiH or SiOH is broken thereby improving endurance of the non-volatile memory device of the present invention.

In another example embodiment of the present invention an annealing process using a gas having atoms with an atomic weight greater than that of hydrogen (H) may be performed against the inner oxide layer 114 in place of (or in addition to) the plasma nitration process. As a result of the annealing process, the atoms having an atomic weight greater than that of hydrogen (H) are diffused into the inner oxide layer. The atoms having an atomic weight greater than that of hydrogen (H) may include nitrogen (N), deuterium (D), fluorine (F), chlorine (Cl), etc. For example, the annealing process may be performed at a temperature of about 500° C. to about 700° C.

Accordingly, unsaturated dangling bonds of the inner oxide layer 114 adsorb atoms having an atomic weight greater than that of hydrogen (H), so that the hydrogen (H) near the interface between the tunnel oxide layer 102 and the substrate 100 cannot readily escape from the inner oxide layer 114. Therefore, although the chemical bond of SiH or SiOH at the interface of the tunnel oxide layer 102 and the substrate 100 can be broken, the liberated hydrogen (H) atoms are sufficiently prevented from leaking into the device isolation layer through the inner oxide layer 114.

Figure 4:
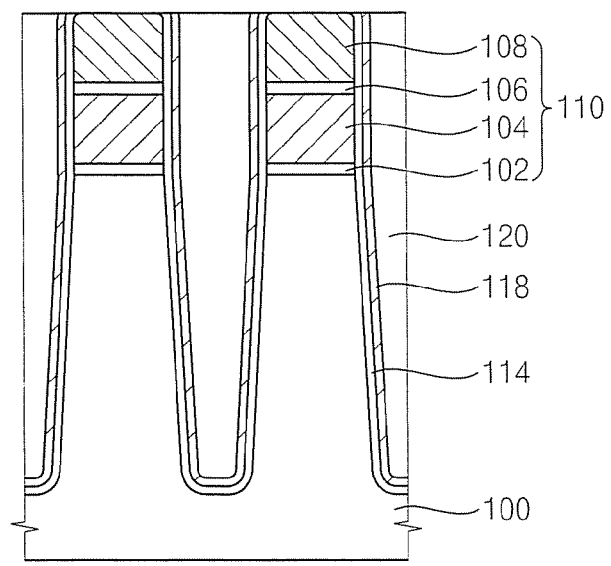

Referring to FIG. 4, an insulation layer (not shown) is formed to a thickness sufficient to fill up the trench 112 on the substrate 100 including the trench 112 between the structures 110. In an example embodiment, the trench 112 has a width of about 90 nm. The inner oxide layer 114 and the silicon nitride layer 118 are formed on the inner wall of the trench 112. It may be difficult to form the insulation layer on the substrate 100 without forming voids in the trench 112. To address this problem of void formation, the insulation layer may be a silicon oxide layer having good gap-fill characteristics. In the present embodiment, the insulation layer includes a silicon oxide or an undoped silicate glass formed through a spin-on-glass process.

The insulation layer is then removed from the substrate 100 by a planarization process such as a chemical mechanical polishing (CMP) process until a surface of the hard mask pattern 108 is exposed. This results in the formation of a preliminary device isolation layer 120.

Figure 5:
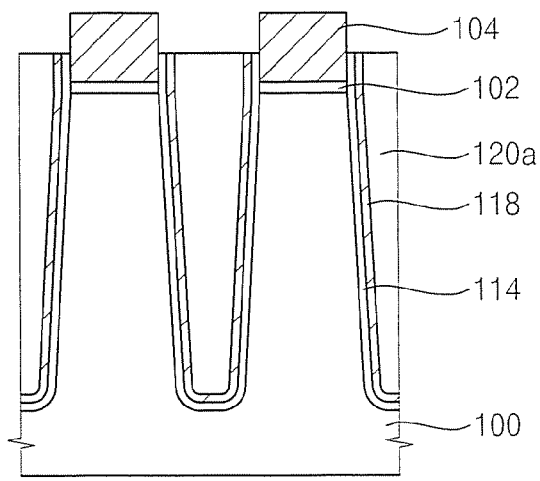

Referring to FIG. 5, the hard mask pattern 108 is removed from the pad oxide pattern 106 by a wet etching process, and an upper portion of the preliminary device isolation layer 120 is removed by a wet etching process, thereby forming the device isolation layer 120a in the trench 112 of the substrate 100. In an example embodiment of the present invention, a top surface of the device isolation layer 120a is lower than a top surface of the first conductive pattern 104 and is higher than a top surface of the tunnel oxide pattern 102. When the upper portion of the preliminary device isolation layer 120 is removed, portions of the inner oxide layer 114 and the silicon nitride layer 118 are also removed simultaneously with the preliminary device isolation layer 120. As a result, the surface of the first conductive pattern 104 is also exposed to surroundings when the upper portion of the preliminary device isolation layer 120 is removed.

Figure 6:
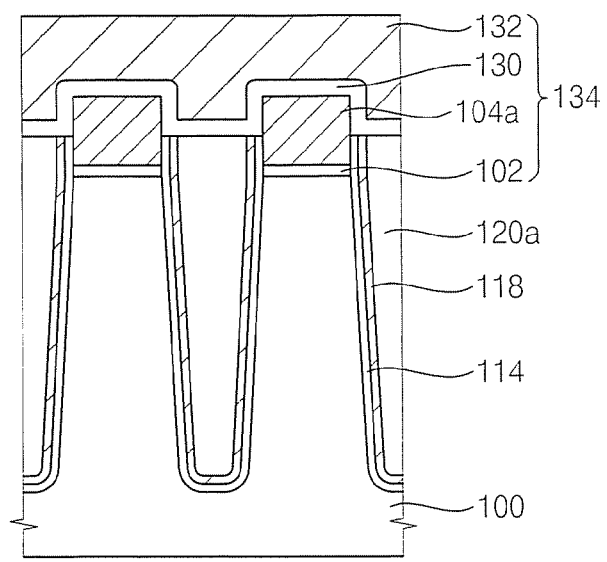

Referring to FIG. 6, a dielectric layer (not shown) is formed on the exposed surface of the first conductive pattern 104 and on a top surface of the device isolation layer 120a. In an example embodiment, the dielectric layer includes an oxide/nitride/oxide (ONO) structure in which a silicon oxide layer and a silicon nitride layer are sequentially stacked. In another example embodiment, the dielectric layer may comprise a metal oxide having a dielectric constant greater than that of silicon oxide. A second conductive layer (not shown) is formed on the dielectric layer by depositing doped polysilicon or a metal onto the dielectric layer. In an example embodiment, the metal for the second conductive layer may have a work function greater than about 4.5 eV.

A second hard mask pattern (not shown) is formed on the second conductive layer having a line shape extending in a second direction perpendicular to the first direction, so that the second conductive layer is partially exposed through the second hard mask pattern. The second conductive layer, the dielectric layer and the first conductive pattern 104 are sequentially etched by an etching process using the second mask pattern as an etching mask, thereby forming a gate structure 134 including a floating gate 104a, a dielectric pattern 130 and a control gate 132.

Then, a hydrogen passivation process may be performed on the substrate including the gate structure 134, so that a sufficient amount of hydrogen gas is supplied to the substrate 100. As a result, hydrogen atoms can be sufficiently trapped by the interface traps between the active region of the substrate 100 and the tunnel oxide pattern 102. That is, the dangling bonds of the interface between the substrate 100 and the tunnel oxide pattern 102 adsorb the hydrogen (H) atoms, thereby reducing the interface traps between the tunnel oxide layer 102 and the substrate 100.

According to the present embodiment, a silicon nitride layer is formed on the inner oxide layer in the trench by a plasma nitration process. As a result, although chemical bonds of SiH or SiOH in the interface between the tunnel oxide pattern and the substrate are broken and hydrogen (H) atoms are liberated in the interface by an operation of the non-volatile memory device, the liberated hydrogen (H) atoms are adsorbed by dangling bonds of the interface, so that the liberated hydrogen atoms are prevented from leaking into a device isolation layer. As a result, the non-volatile memory device including the silicon nitride layer in the trench has improved endurance and reliability.

Embodiment 2

Figure 7:
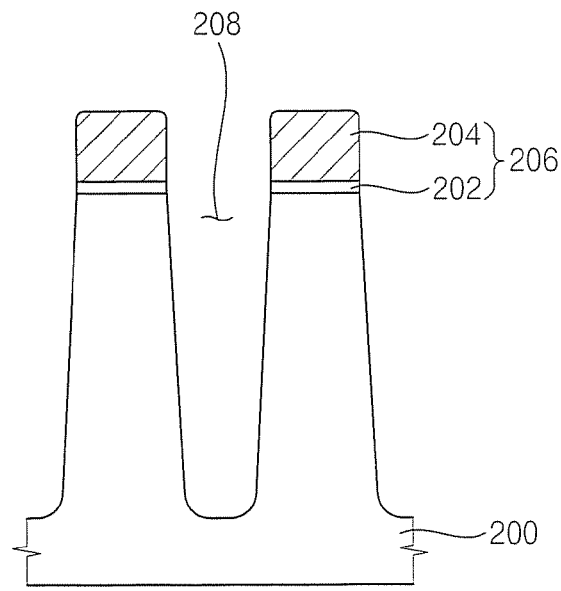
FIGS. 7 to 13 are cross-sectional views illustrating processing steps for a method of manufacturing a non-volatile memory device according to a second example embodiment of the present invention.

FIGS. 7 to 13 are cross-sectional views illustrating processing steps for a method of manufacturing a non-volatile memory device according to a second example embodiment of the present invention. Referring to FIG. 7, a pad oxide layer (not shown) is formed on a substrate 200 comprising a semiconductor material such as silicon. For example, the pad oxide layer may be formed by a thermal oxidation process for oxidizing a surface of the substrate 200 or by a chemical vapor deposition (CVD) process for depositing silicon oxide onto the substrate 200. In the present embodiment, the pad oxide layer is formed to a thickness of about 10 Å to about 100 Å. A hard mask layer (not shown) is formed on the pad oxide layer by depositing silicon nitride onto the pad oxide layer. The hard mask layer is to be formed into a mask pattern for forming a trench as a device isolation area in a subsequent process, so that the mask pattern defines an area in which a floating gate electrode is to be formed. Accordingly, the hard mask layer is formed to a thickness greater than a thickness of the floating gate electrode. In addition, a portion of the hard mask layer may be additionally removed during subsequent cleaning and polishing processes, so that the hard mask layer is formed to have an additional thickness compensating for an amount of the removed thickness during the cleaning and polishing processes. In the present embodiment, the hard mask layer is formed to a thickness that is greater than that of the floating gate as much as about 100 Å to about 3000 Å.

Figure 8:
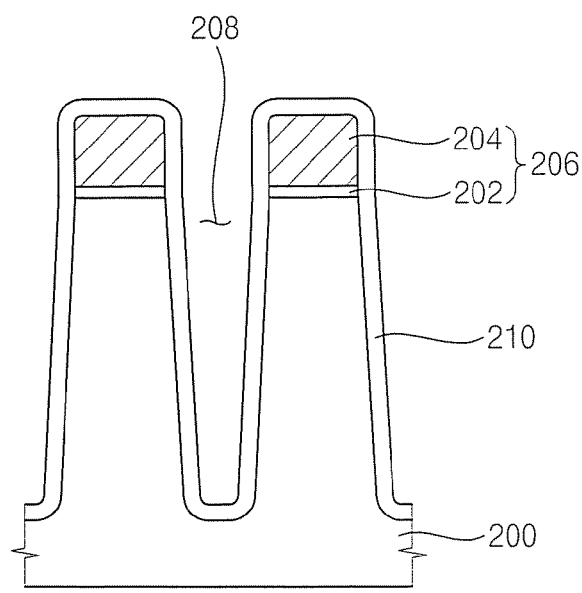

A photoresist pattern (not shown) is formed on the hard mask layer by a photolithography process. A top surface of the hard mask layer corresponding to a field region of the substrate in which the device isolation layer is to be formed is partially exposed through the photoresist pattern. The hard mask layer and the pad oxide layer are sequentially etched by an etching process using the photoresist pattern as an etching mask, thereby forming a mask pattern structure 206 including a pad oxide pattern 202 and a hard mask pattern 204 that are sequentially stacked on the substrate 200. A surface of the substrate 200 is then etched by an etching process using the mask pattern structure 206 as an etching mask, so that a trench 208 is formed at the field region of the substrate 100. Referring to FIG. 8, an inner oxide layer 210 is formed along an inner wall of the trench 208, to thereby cure damage to the substrate 200 during the etching process and minimizing current leakage through the trench 208. In an example embodiment, the inner oxide layer 210 may be formed by a thermal oxidation process.

The inner oxide layer 210 may be formed on sidewalls of and a top surface of the mask pattern structure 206 as well as the inner wall of the trench 208 in accordance with a type of the oxidation process used thereof. For example, when an in-situ steam generation (ISSG) process is performed against the inner wall of the trench 208, an oxidation reaction is so actively generated on the inner wall of the trench that a silicon oxide is formed on the sidewalls and top surface of the mask pattern structure 206 as well as on the inner wall of the trench 208. According to the ISSG process, oxygen and hydrogen gases are reacted with each other in a low pressure chamber under a predetermined condition, and hydrogen atoms and hydroxyl radicals are generated and provided onto the surface of the substrate 200. In another example embodiment of the present invention, the inner oxide layer 210 may be formed only on the inner wall of the trench 208 and sidewalls of the pad oxide pattern 202, but not on the hardmask pattern 204.

Figure 9:
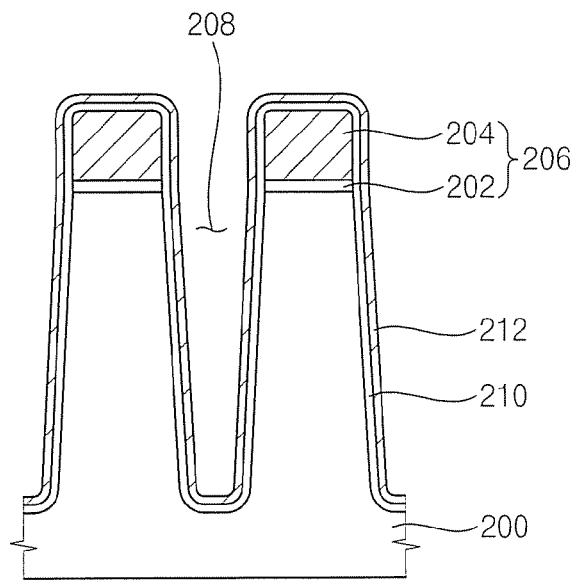

Referring to FIG. 9, the inner oxide layer 210 is sufficiently cured, so that hydrogen atoms in the interface between the substrate 200 and the pad oxide pattern 202 are sufficiently prevented from leaking into a subsequently formed device isolation layer. A nitration process is performed against a surface of the inner oxide layer 210, thereby forming a silicon nitride layer 212 on the inner oxide layer 210. In the present embodiment, a plasma nitration process may be conventionally performed at a temperature of about 15° C. to about 100° C. thereby forming the silicon nitride layer 212. An example reaction gas used in the plasma nitration process may include ammonia (NH3) gas. A process for forming the silicon nitride layer 212 is the same as that described in Embodiment 1 with reference to FIG. 3.

In another example embodiment of the present invention, an annealing process using a gas having atoms with a greater atomic weight than hydrogen (H) may be performed against the inner oxide layer 210 in place of the plasma nitration process. As a result of the annealing process, the atoms having an atomic weight greater than that of hydrogen (H) are diffused into the inner oxide layer. The atoms having an atomic weight greater than that of hydrogen (H) may include nitrogen (N), deuterium (D), fluorine (F), and chlorine (Cl). Other atoms may also be used. According to the above nitration process or the annealing process, liberated hydrogen (H) atoms are sufficiently prevented from leaking into the device isolation layer through the inner oxide layer 210.

Figure 10:
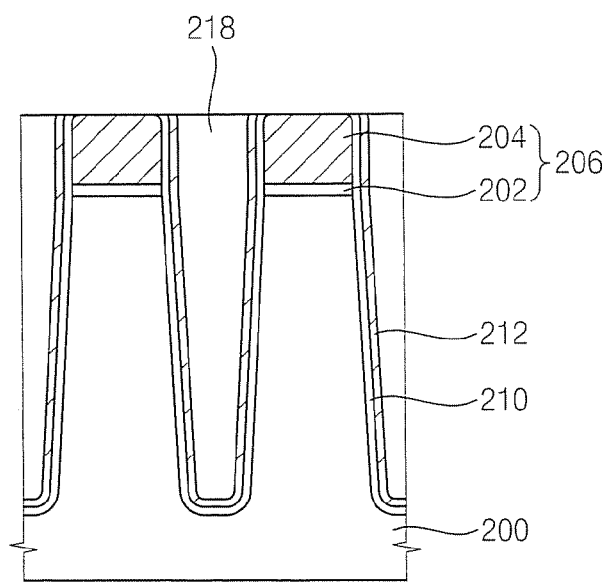

Referring to FIG. 10, a first insulation layer (not shown) is formed to a thickness sufficient to fill up the trench 208 on the substrate 200 including the trench 208 between the mask pattern structures 206. In an example embodiment, the trench 208 has a width of about 90 mm, and moreover, the inner oxide layer 210 and the silicon nitride layer 212 are formed on the inner wall of the trench 208. Therefore, it may be difficult to form the first insulation layer on the substrate 200 without the presence of voids therein. Accordingly, the first insulation layer may include a silicon oxide layer having good gap-filling characteristics. In the present embodiment, the first insulation layer includes an undoped silicate glass. The first insulation layer is then removed from the substrate 200 by a planarization process such as a chemical mechanical polishing (CMP) process until a surface of the hard mask pattern 204 is exposed, thereby forming a preliminary device isolation layer 218.

Figure 11:
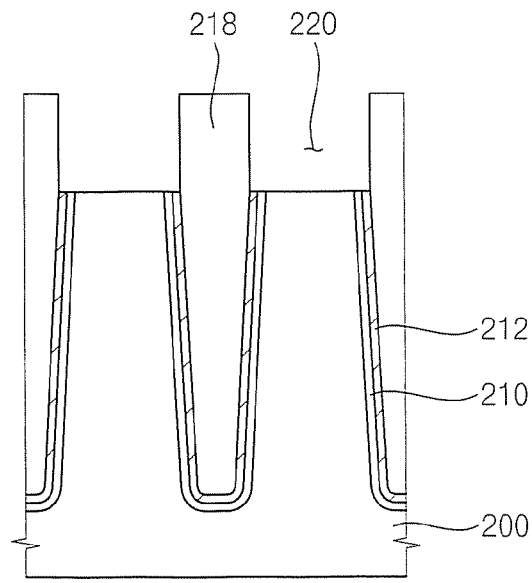

Referring to FIG. 11, the hard mask pattern 204 is removed from the pad oxide pattern 202 by a wet etching process, and the pad oxide pattern 202 is removed from the substrate 200 by a wet etching process. Portions of the inner oxide layer 210 and the silicon nitride layer 212 are also removed from the sidewall of the mask pattern structure 206 simultaneously when the pad oxide pattern 202 is removed from the substrate 200. Particularly, an oxide or particles on the hard mask pattern 204 are cleaned away by an aqueous HF solution, and then the hard mask pattern 204 is removed from the pad oxide pattern 202 using an etching solution including phosphoric acid (H3PO4). The pad oxide pattern 202 and the inner oxide layer 210 may be removed from the substrate 200 using a mixture of hydroxyl ammonium (NH4OH), hydrogen peroxide (H2O2) and water (H2O). Accordingly, a first opening 220 is formed at an active region of the substrate 200 in which the floating gate electrode is to be formed in a subsequent process.

Figure 12:
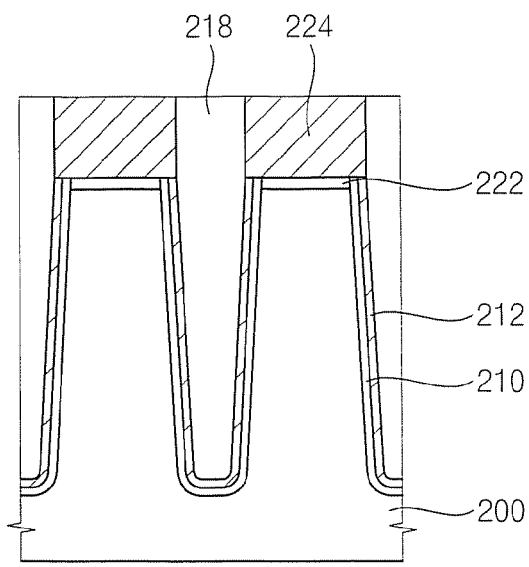

Referring to FIG. 12, a tunnel oxide layer 222 is formed on a surface of the substrate 200 exposed through the first opening 220. In the present embodiment, the tunnel oxide layer 222 may comprise silicon oxide formed on the substrate 200 by a thermal oxidation process. In the thermal oxidation process, an oxidized portion grows downwardly though the substrate 200 (i.e., the surface of the substrate 200 is lowered), to thereby form the tunnel oxide layer 222 at a bottom of the first opening 220. Thus, the tunnel oxide layer 222 can become surrounded by the silicon nitride layer 212 as shown in FIG. 12. A first conductive layer (not shown) is formed to a thickness sufficient to fill up the first opening 220 on the substrate 200. The first conductive layer is to be formed into a floating gate electrode in a subsequent process. In an example embodiment, polysilicon doped with impurities may be deposited onto the substrate 200 by a low pressure chemical vapor deposition (LPCVD) process. The impurities may be doped into the polysilicon by a diffusion of POCl3, an ion implantation and an in-situ doping process in which the impurities are doped into the polysilicon simultaneously with the LPCVD process. The first conductive layer is then removed from the substrate 200 by a planarization process such as a chemical mechanical polishing (CMP) process until a surface of the preliminary device isolation layer 218 is exposed, thereby forming a first conductive pattern 224 in the first opening 220.

Figure 13:
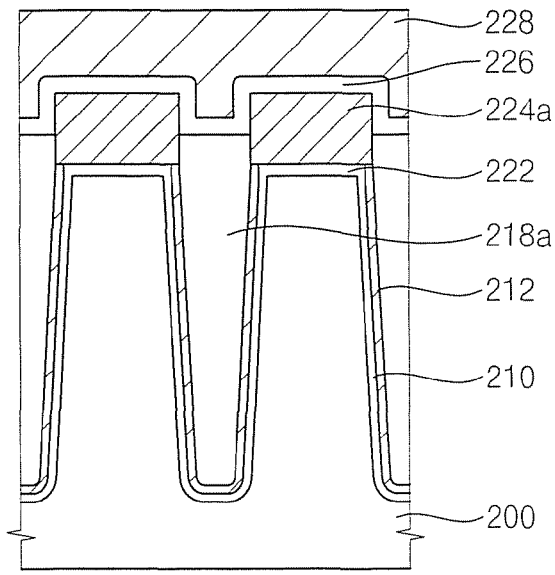

Referring to FIG. 13 an upper portion of the preliminary device isolation layer 218 is removed, so that upper sidewalls of the first conductive pattern 224 are exposed to surroundings, thereby forming a device isolation layer 218a. The inner oxide layer 210 and the silicon nitride layer 212 are also removed simultaneously when the upper portion of the preliminary device isolation layer 218 is removed, so that the upper sidewalls of the first conductive pattern 224 are exposed to surroundings. Thereafter, a dielectric layer (not shown) is formed on the exposed surface of the first conductive pattern 224 and on a top surface of the device isolation layer 218a. In an example embodiment, the dielectric layer includes an oxide/nitride/oxide (ONO) structure in which a silicon oxide layer, a silicon nitride layer and a silicon oxide layer are sequentially stacked. In another example embodiment, the dielectric layer may comprise metal oxide having a dielectric constant greater than that of silicon oxide. A second conductive layer (not shown) is formed on the dielectric layer by depositing doped polysilicon or a metal onto the dielectric layer. A second hard mask pattern (not shown) is formed on the second conductive layer, so that the second conductive layer is partially exposed through the second hard mask pattern. The second conductive layer, the dielectric layer and the first conductive pattern 224 are sequentially etched by an etching process using the second mask pattern as an etching mask, thereby forming a gate structure including a floating gate 224a, a dielectric pattern 226 and a control gate 228.

Then, a hydrogen passivation process may be performed on the substrate 200 including the gate structure, so that a sufficient amount of hydrogen gas is supplied to the substrate 200. As a result, hydrogen atoms are sufficiently trapped by the interface traps between the active region of the substrate 200 and the tunnel oxide pattern 222. That is, the dangling bonds of the interface between the substrate 200 and the tunnel oxide pattern 222 adsorb the hydrogen (H) atoms, thereby reducing the interface traps between the tunnel oxide pattern 222 and the substrate 200.

According to the present embodiment, a tunnel oxide pattern is surrounded by a silicon nitride layer. As a result, although chemical bonds of SiH or SiOH in the interface between the tunnel oxide pattern and the substrate are broken and hydrogen (H) atoms are liberated in the interface due to an operation of the non-volatile memory device, the liberated hydrogen (H) atoms are adsorbed by dangling bonds of the interface, so that the liberated hydrogen atoms are prevented from leaking into a device isolation layer. As a result, the non-volatile memory device including the silicon nitride layer in the trench has improved endurance and reliability.

FIGS. 14 to 20 are cross-sectional views illustrating processing steps for a method of manufacturing a non-volatile memory device according to a third example embodiment of the present invention. The present embodiment is the same as the first example embodiment except a method of forming the device isolation layer and a position of the silicon nitride layer is different. The reference numerals in the present example embodiment denote the elements having the same reference numerals in the first example embodiment, and thus the detailed descriptions of the same elements will be omitted.

Figure 14:
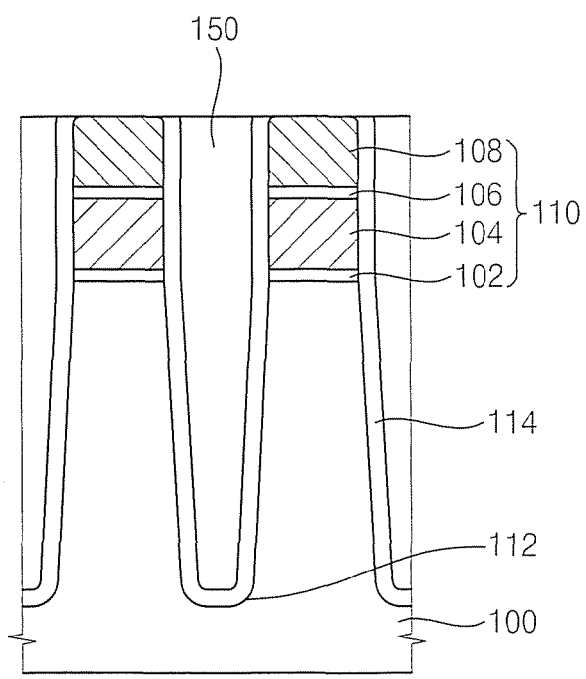
FIGS. 14 to 20 are cross-sectional views illustrating processing steps for a method of manufacturing a non-volatile memory device according to a third example embodiment of the present invention.

The trench 112 is formed on the substrate 100 through a process the same as that described with reference to FIGS. 1 to 2, and the inner oxide layer 114 is formed along the inner wall of the trench 112. Referring to FIG. 14, a first insulation layer (not shown) is formed to a thickness sufficient to fill up the trench 112 on the substrate 100 including the trench 112 between the structures 110. In an example embodiment, the first insulation layer may comprise a silicon oxide material having good gap-filling characteristics. For example, the first insulation layer may include an undoped silicate glass. The first insulation layer is then removed from the substrate 100 by a planarization process such as a chemical mechanical polishing (CMP) process until a surface of the hard mask pattern 108 is exposed, thereby forming a first preliminary device isolation layer 150.

Figure 15:
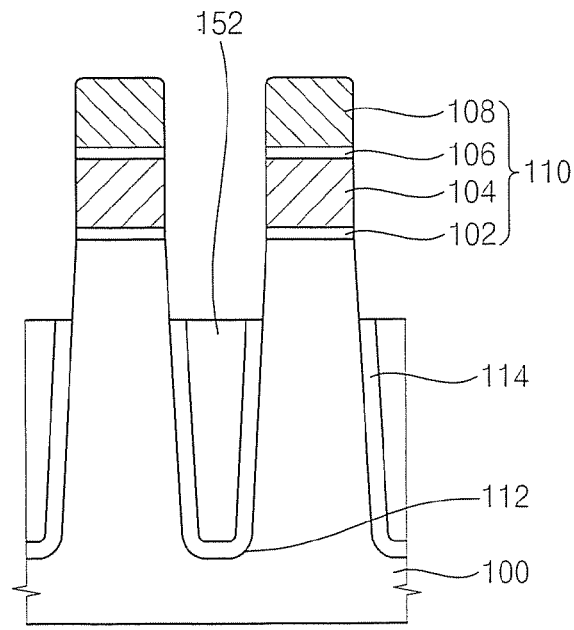

Referring to FIG. 15, an upper portion of the first preliminary device isolation layer 150 is removed, thereby forming the first device isolation layer 152 in the trench 112 of the substrate 100. In an example embodiment, the upper portion of the first preliminary device isolation layer 150 is removed by a wet etching process, thereby minimizing damage to neighboring patterns during the removal of the upper portion of the first preliminary device isolation layer 150. A top surface of the first device isolation layer 152 is formed to be lower than the tunnel oxide pattern 102, so that an upper sidewall of the trench 112, a sidewall of the tunnel oxide pattern 102, sidewalls of the first conductive pattern 104, a sidewall of the pad oxide pattern 106 and sidewalls and a top surface of the hard mask pattern 108 are exposed to surroundings.

Figure 16:
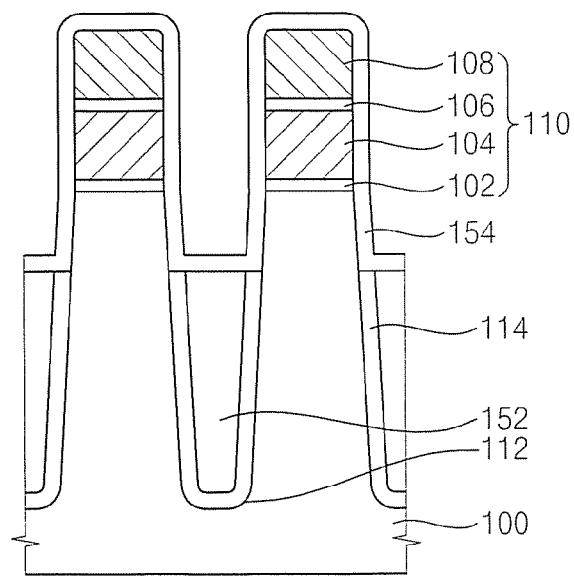

Referring to FIG. 16, a buffer oxide layer 154 is conformally formed on exposed surfaces of the trench 112, the tunnel oxide pattern 102, the first conductive pattern 104, the pad oxide pattern 106 and the hard mask pattern 108. For example, the buffer oxide layer 154 may be formed through a thermal oxidation process such as an ISSG process or a CVD process.

Figure 17:
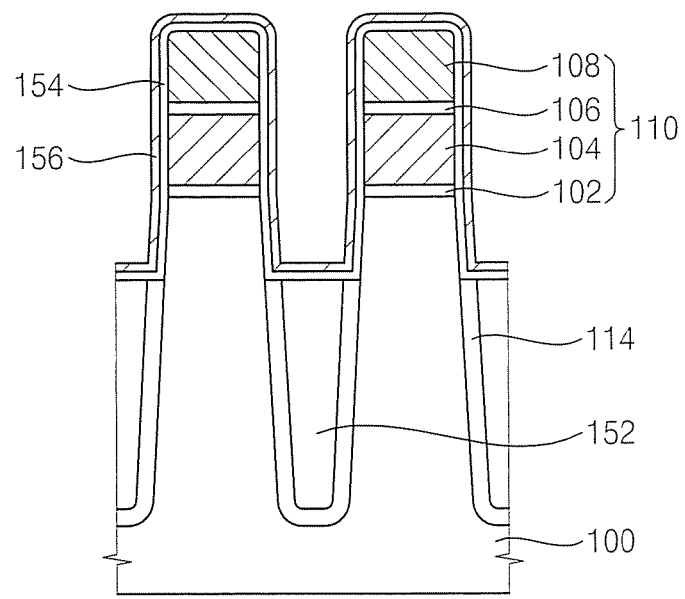

Referring to FIG. 17, a nitration process is performed on a surface of the buffer oxide layer 154, so that a silicon nitride layer 156 is formed on the buffer oxide layer 154. The nitration process may be the same as described in Embodiment 1. In the present embodiment, the silicon oxide layer 156 is conformally formed on the upper portion of the trench 112, sidewalls of the tunnel oxide pattern 102 and the first conductive pattern 104, and the sidewall and the top surface of the hard mask pattern 108. That is, the silicon nitride layer 156 is not formed on a whole inner wall of the trench 112, but formed only on the upper portion of the inner wall of the trench 112 around the tunnel oxide pattern 102, thereby minimizing current leakage through the silicon nitride layer 156.

While the present embodiment discloses a low temperature nitration process for the formation of the silicon nitride layer, a high temperature plasma nitration process, which is not illustrated in figures, may also be used for a formation of the silicon nitride layer between the buffer oxide layer and the trench in place of the disclosed low temperature nitration process, as would be known to one of the ordinary skill in the art. However, there may be a problem that the silicon nitride layer formed by the high temperature plasma nitration process makes contact with a channel region and source/drain regions, thereby increasing current leakage through the silicon nitride layer.

Figure 18:
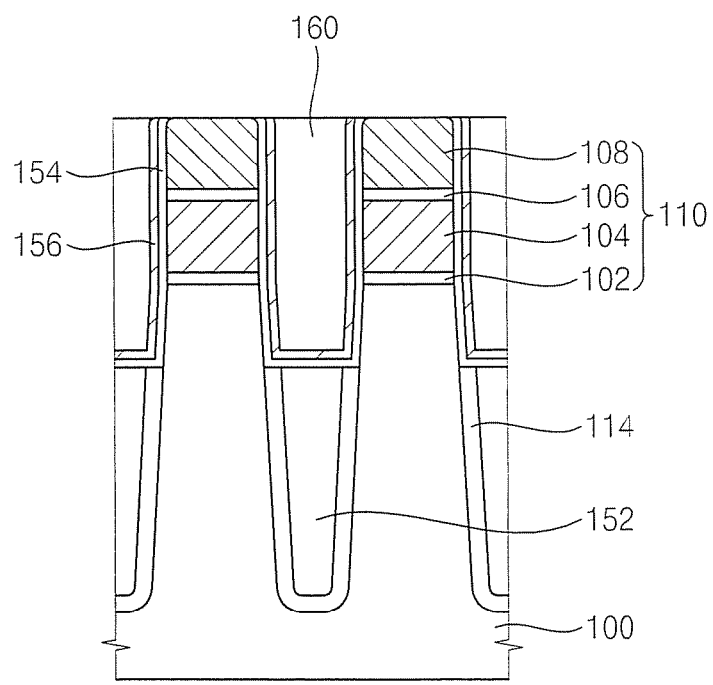

Referring to FIG. 18, a second insulation layer (not shown) is formed to a thickness sufficient to fill up the trench 112 and a space between the structures 110 on the substrate 100 that includes the first device isolation layer 152 and the structure 110. The second insulation layer is then removed from the substrate 100 by a planarization process such as a chemical mechanical polishing (CMP) process until a surface of the hard mask pattern 108 is exposed, thereby forming a second preliminary device isolation layer 160.

Accordingly, an insulation material is deposited onto the substrate 100 to a thickness to fill up the trench 112 and the space between the structures 110 through two deposition steps, so that an insulation layer is formed on the substrate 100 without voids.

Figure 19:
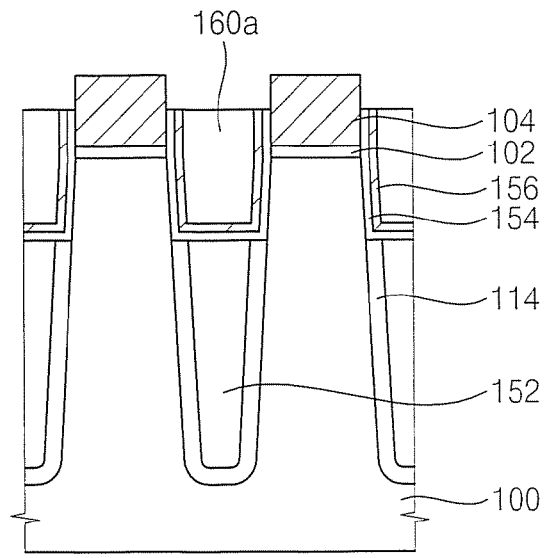

Referring to FIG. 19, the hard mask pattern 108 and the pad oxide pattern 106 are removed by a wet etching process. Then, an upper portion of the second preliminary device isolation layer 160 is removed by a wet etching process, thereby forming a second device isolation layer 160*a* over the first device isolation layer 152. In the present embodiment, a top surface of the second device isolation layer 160*a* is lower than that of the first conductive pattern 104 and higher than that of the tunnel oxide pattern 102. When the upper portion of the second preliminary device isolation layer 160 is removed, the inner oxide layer 154 and the silicon nitride layer 156 are also removed from upper sidewalls of the first conductive pattern 104 simultaneously with the second preliminary device isolation layer 160. As a result, the upper portion of the first conductive pattern 104 is exposed to surroundings when the wet etching process for removing the second preliminary device isolation layer is completed.

Figure 20:
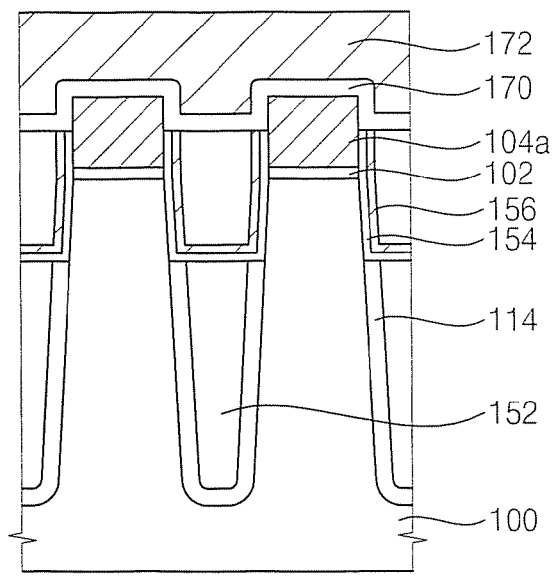

Referring to FIG. 20, a dielectric layer (not shown) is formed on the exposed surface of the first conductive pattern 104 and on a top surface of the second device isolation layer 160*a*. A second conductive layer (not shown) is formed on the dielectric layer. A second hard mask pattern (not shown) is formed on the second conductive layer, so that the second conductive layer is partially exposed through the second hard mask pattern. The second conductive layer, the dielectric layer and the first conductive pattern 104 are sequentially etched by an etching process using the second mask pattern as an etching mask, thereby forming a gate structure including a floating gate 104*a*, a dielectric pattern 170 and a control gate 172.

Then, a hydrogen passivation process may be performed on the substrate including the gate structure, so that a sufficient amount of hydrogen gas is supplied to the substrate 100. As a result, hydrogen atoms are sufficiently trapped by the interface traps between the active region of the substrate 100 and the tunnel oxide pattern 102. In this case, the dangling bonds of the interface between the substrate 100 and the tunnel oxide pattern 102 adsorb the hydrogen (H) atoms, thereby reducing the interface traps between the tunnel oxide layer 102 and the substrate 100.

According to the present embodiment, a silicon nitride layer is formed on the sidewalls of the tunnel oxide pattern, so that the tunnel oxide pattern is surrounded by the silicon nitride layer. As a result, although chemical bonds of SiH or SiOH in the interface between the tunnel oxide pattern and the substrate are broken and hydrogen (H) atoms are liberated in the interface due to an operation of the non-volatile memory device, the liberated hydrogen (H) atoms are adsorbed by dangling bonds of the interface, so that the liberated hydrogen atoms are prevented from leaking into a device isolation layer. In addition, the silicon nitride layer is not formed on a whole inner wall of the trench, thereby minimizing current leakage through the silicon nitride layer.

As a modified example embodiment of the present invention, an annealing process using a gas having atoms of which an atomic weight is greater than that of hydrogen (H) may be performed against the inner oxide layer 114 in place of the plasma nitration process. As a result of the annealing process, the atoms having an atomic weight greater than that of hydrogen (H) are diffused into the inner oxide layer. The atoms having an atomic weight greater than that of hydrogen (H) may include nitrogen (N), deuterium (D), fluorine (F), and chlorine (Cl). Other atoms may also be diffused.

FIGS. 21 to 27 are cross-sectional views illustrating processing steps for a method of manufacturing a non-volatile memory device according to a fourth example embodiment of the present invention. This fourth embodiment is the same as the second example embodiment except a method of forming the device isolation layer and a position of the silicon nitride layer. The trench 208 is formed on the substrate 200 through the same process as described with reference to FIGS. 7 to 8, and the inner oxide layer 210 is formed along the inner wall of the trench 208.

Figure 21:
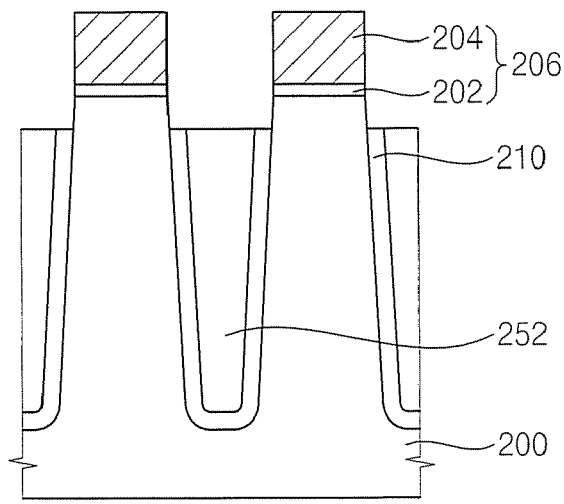
FIGS. 21 to 27 are cross-sectional views illustrating processing steps for a method of manufacturing a non-volatile memory device according to a fourth example embodiment of the present invention.

Referring to FIG. 21, a first insulation layer (not shown) is formed to a thickness sufficient to fill up the trench 208 between the mask pattern structures 206 on the substrate 200. The first insulation layer is then removed by a planarization process such as a chemical mechanical polishing (CMP) process until a surface of the hard mask pattern 204 is exposed, thereby forming a first preliminary device isolation layer (not shown).

An upper portion of the first preliminary device isolation layer is removed, thereby forming a first device isolation layer 252 in the trench 208. In the present embodiment, the first preliminary device isolation layer is removed by a wet etching process, thereby minimizing damage to neighboring patterns around the upper portion of the first preliminary device isolation layer. A top surface of the first device isolation layer 252 is lower than a top surface of the substrate 200.

Figure 22:
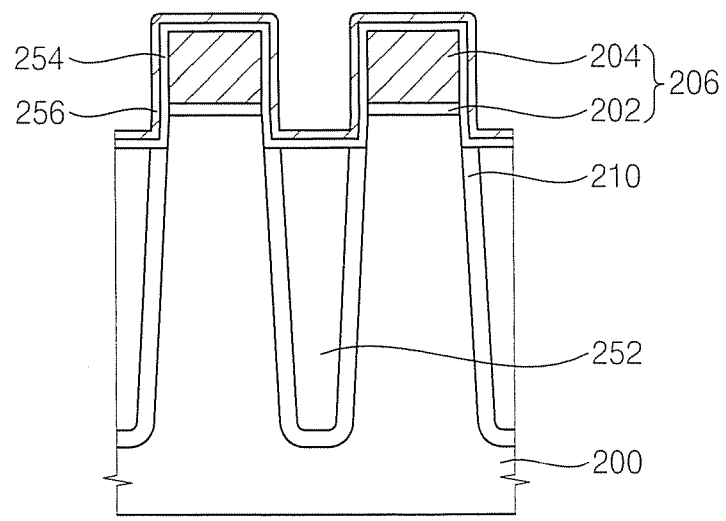

Referring to FIG. 22, a buffer oxide layer 254 is conformally formed on the first device isolation layer 252 and on the upper sidewall of the trench 208, the sidewall of the pad oxide pattern 202, and the sidewall and the top surface of the hard mask pattern 204. For example, the buffer oxide layer 254 may be formed by a thermal oxidation process such as an ISSG process or a CVD process.

A nitration process is performed on a surface of the butter oxide layer 254, thereby forming a silicon nitride layer 256 on the buffer oxide layer 254. The nitration process may be the same as described in Embodiment 1.

In the present embodiment, unlike the Embodiment 1, the silicon nitride layer 256 is conformally formed only on the upper portion of the trench 208, sidewalls of the pad oxide pattern 202, and the sidewall and the top surface of the hard mask pattern 204. That is, the silicon nitride layer 256 is not formed on a whole inner wall of the trench 208, but is formed only on the upper portion of the inner wall of the trench 208, thereby minimizing current leakage through the silicon nitride layer 256.

While the present embodiment discloses a low temperature nitration process for a formation of the silicon nitride layer, a high temperature plasma nitration process, which is not illustrated in figures, may also be used for a formation of the silicon nitride layer between the buffer oxide layer and the trench in place of the disclosed low temperature nitration process, as would be known to one of the ordinary skill in the art. For example, the plasma nitration process may be performed at a temperature of about 400° C. to about 600° C.

Figure 23:
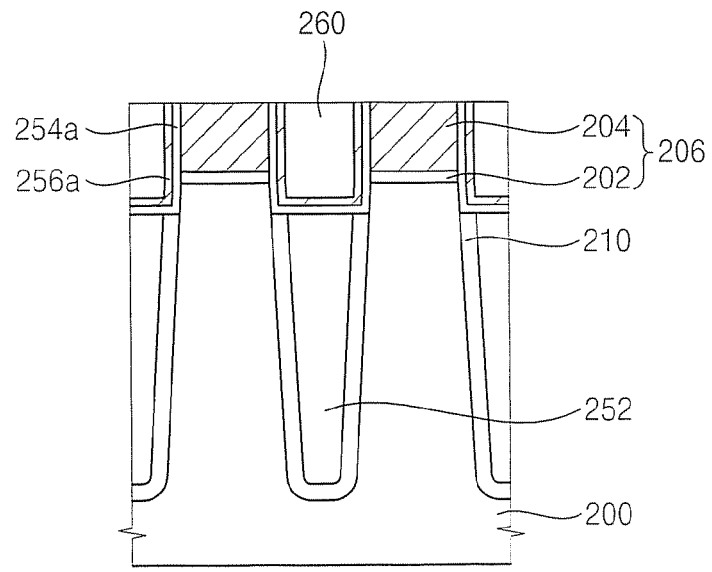

Referring to FIG. 23, a second insulation layer (not shown) is formed to a thickness sufficient to fill up the trench 208 and a space between the structures 206 on the substrate 200 including the first device isolation layer 252 and the structure 206. The second insulation layer is then removed from the substrate 200 by a planarization process such as a chemical mechanical polishing (CMP) process until a surface of the hard mask pattern 204 is exposed, thereby forming the second preliminary device isolation layer 260. In addition, the buffer oxide layer 254 and the silicon nitride layer 256 are formed into a buffer oxide pattern 254a and a silicon nitride pattern 256a by the planarization process. Accordingly, an insulation material is deposited onto the substrate 200 to a thickness to fill up the trench 208 and the space between the structures 206 through two deposition steps, so that an insulation layer is formed on the substrate 200 without voids.

Figure 24:
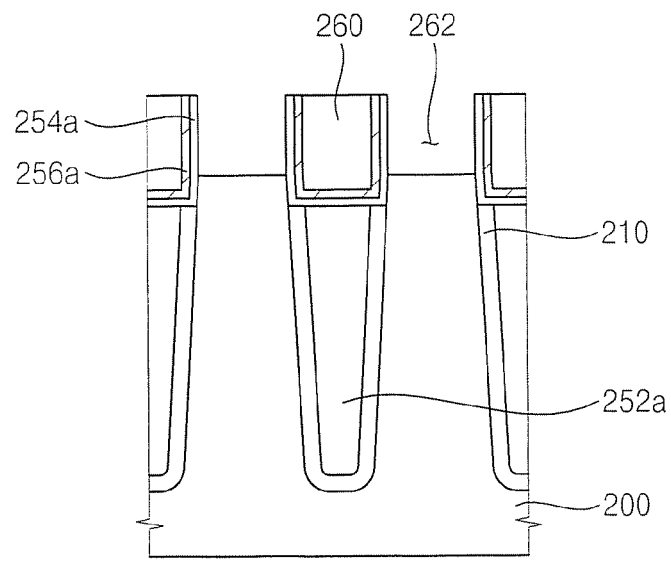

Referring to FIG. 24, the hard mask pattern 204 and the pad oxide pattern 202 are removed from the substrate 200 by a wet etching process, thereby forming an opening 262 through which a surface of the substrate 200 is exposed. The buffer oxide pattern 254a and the silicon nitride pattern 256a are not removed from the sidewalls of the second preliminary device isolation layer 260 in the wet etching process. That is, the inner oxide pattern 254a and the silicon nitride pattern 256a still remain on the inner wall of the opening 262.

Figure 25:
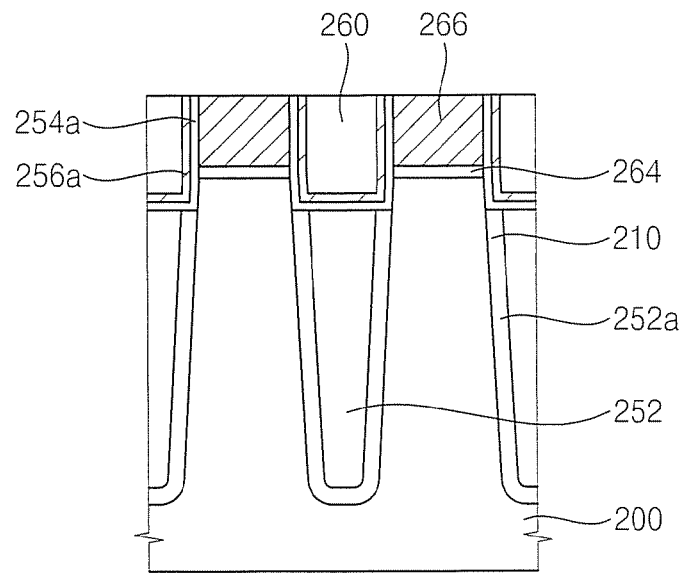

Referring to FIG. 25, a tunnel oxide layer 264 is formed on a surface of the substrate 200 exposed through the opening 262. A first conductive layer (not shown) is formed to a thickness sufficient to fill up the opening 262 on the substrate 200. The first conductive layer is then removed from the substrate 200 by a planarization process such as a chemical mechanical polishing (CMP) process until a surface of the second preliminary device isolation layer 260 is exposed, thereby forming a first conductive pattern 266 on the tunnel oxide layer 264 in the opening 262.

Figure 26:
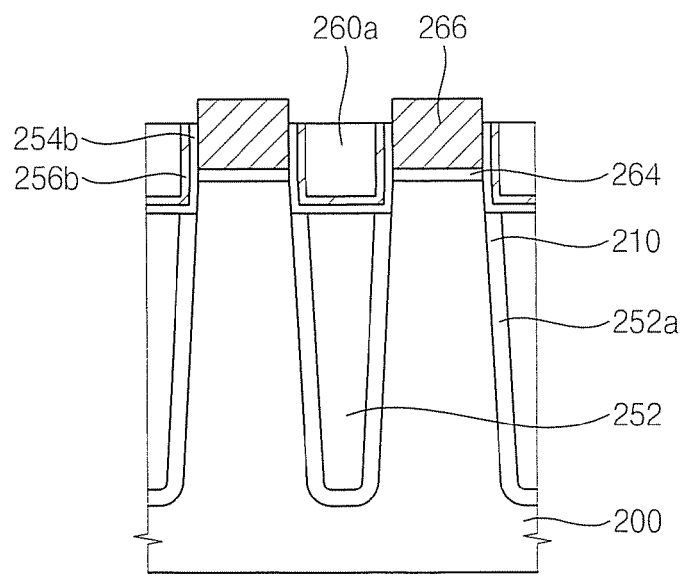

Referring to FIG. 26, an upper portion of the second preliminary device isolation layer 260 is removed and upper sidewalls of the first conductive pattern 266 are exposed to surroundings, thereby forming a second device isolation layer 260a on the first device isolation layer 252. A top surface of the second device isolation layer 260a is lower than that of the first conductive pattern 266 and is higher than that of the tunnel oxide layer 264.

The buffer oxide pattern 254a and the silicon nitride pattern 256a are partially removed from upper sidewalls of the first conductive pattern 266 during an etching process for a formation of the second device isolation layer 260a, so that the upper portion of the first conductive pattern 266 is exposed to surroundings. In FIG. 26, remaining portions of the buffer oxide pattern 254a and the silicon nitride pattern 256a after performing the etching process are represented as reference numerals of 254b and 256b, respectively.

Figure 27:
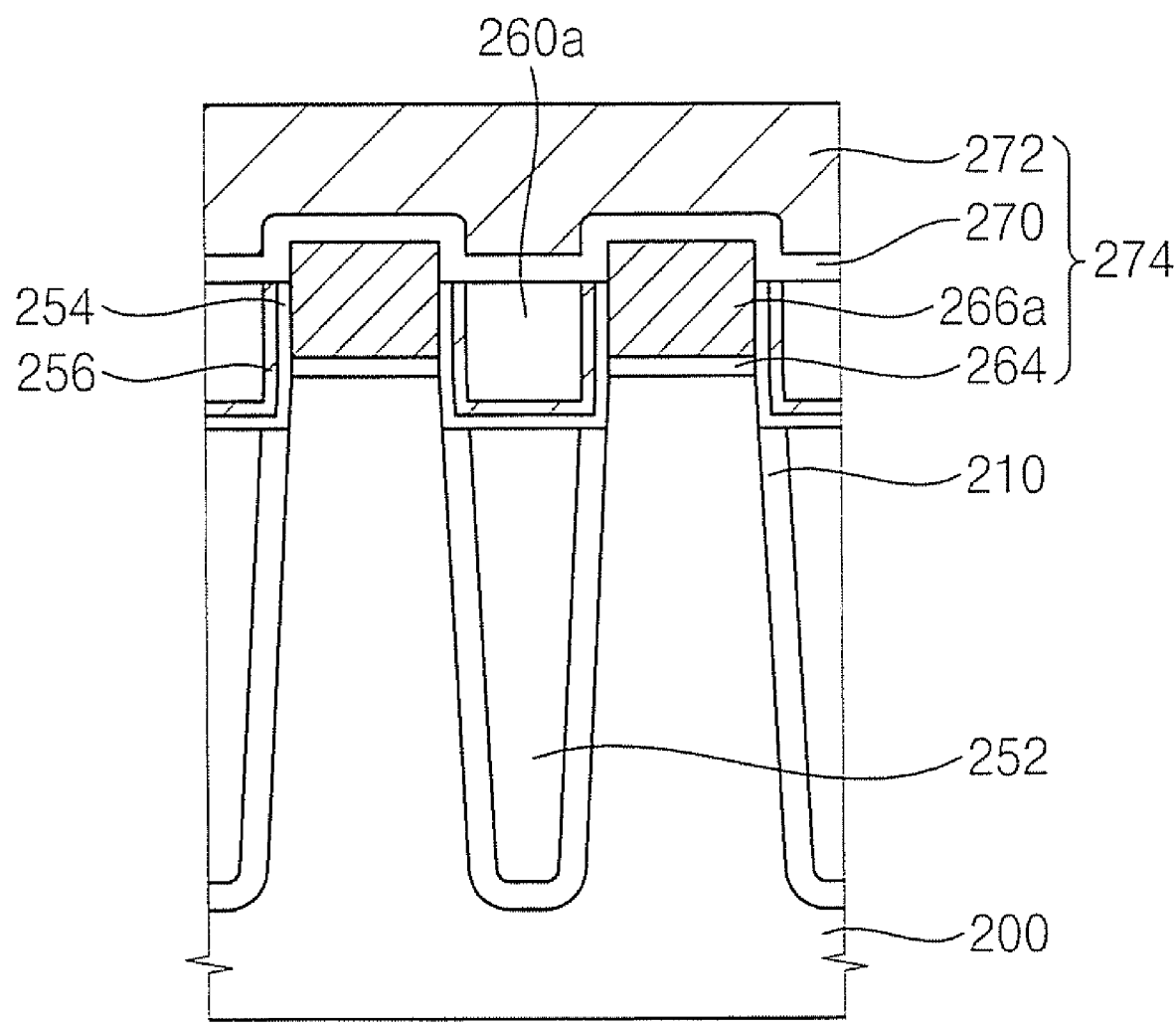

Referring to FIG. 27, a dielectric layer (not shown) is formed on the exposed surface of the first conductive pattern 266 and on a top surface of the second device isolation layer 260a. A second conductive layer (not shown) is formed on the dielectric layer by depositing doped polysilicon or a metal onto the dielectric layer. A second hard mask pattern (not shown) is formed on the second conductive layer, so that the second conductive layer is partially exposed through the second hard mask pattern. The second conductive layer, the dielectric layer and the first conductive pattern 224 are sequentially etched by an etching process using the second mask pattern as an etching mask, thereby forming a gate structure 274 including a floating gate 266a, a dielectric pattern 270 and a control gate 272.

Then, a hydrogen passivation process may be performed on the substrate 200 including the gate structure, so that a sufficient amount of hydrogen gas is supplied to the substrate 200. As a result, hydrogen atoms are sufficiently trapped by the interface traps between the active region of the substrate 200 and the tunnel oxide pattern 264. That is, dangling bonds of the interface between the substrate 200 and the tunnel oxide pattern 264 adsorb the hydrogen (H) atoms, thereby reducing the interface traps between the tunnel oxide pattern 264 and the substrate 200.

According to the present embodiment, a silicon nitride layer is formed on the sidewall of the tunnel oxide pattern, so that the tunnel oxide pattern is surrounded by the silicon nitride layer. As a result, although chemical bonds of SiH or SiOH in the interface between the tunnel oxide pattern and the substrate are broken and hydrogen (H) atoms are liberated in the interface due to an operation of the non-volatile memory device, the liberated hydrogen (H) atoms are adsorbed by dangling bonds of the interface, so that the liberated hydrogen atoms are prevented from leaking into a device isolation layer. In addition, the silicon nitride layer is not formed on an entire inner wall of the trench, thereby minimizing current leakage through the silicon nitride layer.

As a modified example embodiment of the present invention, an annealing process using a gas having atoms of which an atomic weight is greater than that of hydrogen (H) may be performed against the inner oxide layer 114 in place of the plasma nitration process. As a result of the annealing process, the atoms having an atomic weight greater than that of hydrogen (H) are diffused into the inner oxide layer. The atoms having an atomic weight greater than that of hydrogen (H) may include nitrogen (N), deuterium (D), fluorine (F), and chlorine (Cl).

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of forming a semiconductor device, comprising the steps of:
    forming a gate insulation pattern and a first conductive pattern on a semiconductor substrate;
    forming a trench in a portion of the semiconductor substrate extending adjacent the first conductive pattern;
    forming a first electrically insulating layer on a sidewall of the trench;
    filling the trench with a preliminary first device isolation layer that extends on the first electrically insulating layer;
    partially removing the preliminary first device isolation layer and the first electrically insulating layer for a sufficient duration, to expose a portion of the sidewall of the trench and to form a first device isolation pattern at a lower portion of the trench;
    forming a second electrically insulating layer on the exposed portion of the sidewall of the trench;
    curing the second electrically insulating layer for a sufficient duration to increase a degree of impermeability of hydrogen atoms therein;
    refilling the trench with a second device isolation layer; and
    wherein refilling the trench is followed by etching back the second device isolation layer and the cured second electrically insulating layer to expose a sidewall of the first conductive pattern.

2. The method of claim 1, wherein etching back the second device isolation layer and the cured second electrically insulating layer is followed by forming an inter-gate dielectric layer on the exposed sidewall of the first conductive pattern and forming a second conductive pattern on the inter-gate dielectric layer.

3. The method of claim 1, wherein curing the second electrically insulating layer comprises nitrating the second electrically insulating layer to form a silicon nitride layer on the second electrically insulating layer.

4. The method of claim 3, wherein nitrating the second electrically insulating layer comprises nitrating the second electrically insulating layer by performing a plasma nitration process on the second electrically insulating layer at a temperature in a range from about 15° C. to about 100° C.

5. The method of claim 1, wherein curing the second electrically insulating layer comprises annealing the second electrically insulating layer using a gas comprising nitrogen, deuterium, fluorine and/or chlorine.

6. A method of manufacturing a semiconductor device, comprising:
    forming a conductive structure on a substrate, the conductive structure including a gate insulation pattern, a first conductive pattern, a pad insulation pattern and a hard mask pattern that are sequentially stacked on the substrate;
    forming a trench on the substrate by an etching process using the conductive structure as an etching mask;
    forming a first device isolation pattern in the trench by partially filling up the trench with a first insulation material;
    forming a buffer pattern on a surface of the first device isolation pattern, on an inner wall of the trench and on sidewalls of the gate insulation pattern and the first conductive pattern;
    curing the buffer pattern so that hydrogen (H) atoms are prevented from leaking from the substrate;
    forming a second device isolation pattern in the trench by filling up the trench with a second insulation material;
    removing the hard mask pattern and the pad insulation pattern from the substrate to expose the first conductive pattern;
    removing a portion of the second device isolation pattern to partially expose sidewalls of the first conductive pattern; and
    forming a dielectric layer and a second conductive pattern on the first conductive pattern.

7. The method of claim 6, wherein curing the buffer pattern includes nitrating the buffer pattern to form a silicon nitride pattern on the buffer pattern.

8. The method of claim 7, wherein nitrating the buffer pattern is performed by a plasma nitration process at a temperature of about 15° C. to about 100° C.

9. The method of claim 6, wherein curing the buffer pattern includes annealing the buffer pattern using a gas having atoms of which an atomic weight is greater than that of hydrogen (H), the atoms including any one selected from the group consisting of nitrogen (N), deuterium (D), fluorine (F) and chlorine (Cl).

10. The method of claim 6, wherein forming the first device isolation pattern includes:
   forming a preliminary device isolation layer in the trench by filling up the trench with the first insulation material;
   forming a preliminary device isolation pattern by planarizing the preliminary device isolation layer until a surface of the hard mask pattern is exposed; and
   partially removing a portion of the preliminary device isolation pattern by a wet etching process, to expose an upper sidewall of the trench.

11. The method of claim 6, wherein a top surface of the first device isolation pattern is lower than a top surface of the substrate.

12. A method of manufacturing a semiconductor device, comprising:
   forming a structure on a substrate, the structure including a pad insulation pattern and a hard mask pattern that are sequentially stacked on the substrate;
   forming a trench on the substrate by an etching process using the structure as an etching mask;
   forming a first device isolation pattern in the trench by partially filling up the trench with a first insulation material;
   forming a buffer pattern on a surface of the first device isolation pattern, an inner wall of the trench, sidewalls of the pad insulation pattern, and sidewalls and a top surface of the hard mask pattern;
   curing the buffer pattern to prevent hydrogen (H) atoms from leaking from the substrate;
   forming a second device isolation pattern in the trench by filling up the trench with a second insulation material;
   removing the hard mask pattern and the pad insulation pattern from the substrate to form an opening through which the substrate is exposed;
   forming a gate insulation pattern and a first conductive pattern in the opening;
   removing a portion of the second device isolation pattern to partially expose sidewalls of the first conductive pattern; and
   forming a dielectric layer and a second conductive pattern on the first conductive pattern.

13. The method of claim 12, wherein curing the buffer pattern includes nitrating the buffer pattern to form a silicon nitride pattern on the buffer pattern.

14. The method of claim 13, wherein nitrating the buffer pattern is performed by a plasma nitration process at a temperature of about 15° C. to about 100° C.

15. The method of claim 12, wherein curing the buffer pattern includes annealing the buffer pattern using a gas having atoms of which an atomic weight is greater than that of hydrogen (H), the atoms including any one selected from the group consisting of nitrogen (N), deuterium (D), fluorine (F) and chlorine (Cl).

16. The method of claim 12, wherein a surface of the first device isolation pattern is lower than a surface of the substrate.

17. The method of claim 12, after forming a dielectric layer and a second conductive pattern, further comprising supplying hydrogen (H) gas onto the substrate to trap hydrogen atoms in the interface traps between the substrate and the gate insulation pattern.

* * * * *